United States Patent
Yee et al.

(10) Patent No.: US 10,440,830 B2
(45) Date of Patent: Oct. 8, 2019

(54) LASER CARBONIZATION OF POLYMER COATINGS IN AN OPEN-AIR ENVIRONMENT

(71) Applicant: Robert Bosch GmbH, Stuttgart (DE)

(72) Inventors: Seow Yuen Yee, Mountain View, CA (US); Gary Yama, Mountain View, CA (US); Patrick Staley, Sunnyvale, CA (US); Habibullah Ahmad, Sunnyvale, CA (US); Ning Wang, Mountain View, CA (US)

(73) Assignee: Robert Bosch GmbH, Stuttgart (DE)

( * ) Notice: Subject to any disclaimer, the term of this patent is extended or adjusted under 35 U.S.C. 154(b) by 66 days.

(21) Appl. No.: 15/703,543

(22) Filed: Sep. 13, 2017

(65) Prior Publication Data

US 2019/0082540 A1    Mar. 14, 2019

Related U.S. Application Data

(60) Provisional application No. 62/556,139, filed on Sep. 8, 2017.

(51) Int. Cl.
*C23C 16/52* (2006.01)
*H05K 3/10* (2006.01)
(Continued)

(52) U.S. Cl.
CPC ......... *H05K 3/105* (2013.01); *B23K 26/0006* (2013.01); *B23K 26/03* (2013.01);
(Continued)

(58) Field of Classification Search
CPC ..... B23K 26/0626; C23C 16/52; H05K 3/105
(Continued)

(56) References Cited

U.S. PATENT DOCUMENTS 5,071,417 A * 12/1991 Sinofsky .......... A61B 17/00491
606/8
6,652,720 B1   10/2003 Mansouri et al.
(Continued)

OTHER PUBLICATIONS

Musaev, et al., "UV laser ablation of parylene films from gold substrates." Journal of Materials Science, vol. 46, Issue 1, pp. 183-187 (Jan. 2011).
(Continued)

*Primary Examiner* — Que Tan Le
(74) *Attorney, Agent, or Firm* — Maginot Moore & Beck LLP

(57) ABSTRACT

A system for selectively carbonizing a polymer coating on a substrate includes a laser, a memory, and a controller. The memory stores data associated with at least one characteristic of a substrate having a coating that includes a polymer material. The controller is operatively connected to the laser, and is configured to control the laser based on the data such that, in an open-air environment, an interaction between the laser and the polymer material carbonizes a portion of the coating, but does not sustain combustion of the polymer material. A method of producing an article with a selectively carbonized coating includes controlling a laser system such that interaction between a laser and a polymer material forming a coating on a substrate carbonizes a portion of the coating, but does not sustain a combustion of the polymer material in an open-air environment.

20 Claims, 3 Drawing Sheets

(51) Int. Cl.

| | | |
|---|---|---|
| *C23C 16/48* | (2006.01) | |
| *B23K 26/00* | (2014.01) | |
| *B23K 26/06* | (2014.01) | |
| *B23K 26/08* | (2014.01) | |
| *B23K 26/0622* | (2014.01) | |
| *B23K 26/03* | (2006.01) | |
| *C23C 16/30* | (2006.01) | |
| *C23C 16/44* | (2006.01) | |
| *C23C 16/56* | (2006.01) | |
| *B23K 26/352* | (2014.01) | |
| *B23K 103/00* | (2006.01) | |
| *B23K 101/34* | (2006.01) | |
| *B23K 101/38* | (2006.01) | |
| *B23K 103/16* | (2006.01) | |

(52) U.S. Cl.
CPC ...... *B23K 26/0622* (2015.10); *B23K 26/0626* (2013.01); *B23K 26/08* (2013.01); *B23K 26/352* (2015.10); *B23K 26/355* (2018.08); *C23C 16/30* (2013.01); *C23C 16/44* (2013.01); *C23C 16/483* (2013.01); *C23C 16/52* (2013.01); *C23C 16/56* (2013.01); *B23K 2101/34* (2018.08); *B23K 2101/38* (2018.08); *B23K 2103/172* (2018.08); *B23K 2103/42* (2018.08); *B23K 2103/54* (2018.08); *B23K 2103/56* (2018.08); *H05K 2203/107* (2013.01); *H05K 2203/1136* (2013.01)

(58) Field of Classification Search
USPC .................................................. 250/205, 221
See application file for complete search history.

(56) References Cited

U.S. PATENT DOCUMENTS

| | | |
|---|---|---|
| 6,796,166 B1 | 9/2004 | Fountains, III et al. |
| 8,587,188 B1 | 10/2013 | Ingram et al. |

OTHER PUBLICATIONS

Oliveira, et al. "Laser-induced carbon pyrolysis of electrodes for neural interface systems." European Journal of Translational Myology 26.3, pp. 181-186 (2016).

Epilog Laser, "Epilog Fusion M2 Laser Series." https://www.epiloglaser.com/products/fusion-laser-series.htm (retrieved on Aug. 29, 2017).

\* cited by examiner

LASER CARBONIZATION OF POLYMER COATINGS IN AN OPEN-AIR ENVIRONMENT

This Application claims the benefit of priority from U.S. Provisional Application No. 62/556,139 filed on Sep. 8, 2017 and entitled "LASER CARBONIZATION OF POLYMER COATINGS IN AN OPEN-AIR ENVIRONMENT," the disclosure of which is incorporated by reference in its entirety.

TECHNICAL FIELD

This disclosure relates to carbonization, and in particular to laser carbonization of polymer material coatings.

BACKGROUND

Carbonized polymer-based electronic devices have gained increasing popularity for a wide variety of uses including use as electrodes, electrochemical sensors, and conductive contacts. This may be due in part to such devices exhibiting favorable properties such as bio-compatibility, high electrochemical performance, chemical inertness, mechanical robustness, and a large effective surface area of contact.

Carbonization is a process of converting at least a portion of a material into carbon or a carbon-containing residue via pyrolysis. A typical pyrolysis process involves using a furnace at high temperature in an inert environment. The high temperatures involved place restrictions on materials and processes that could be used for fabrication. Since an entire article is placed within the furnace, it is extremely difficult or impossible to selectively carbonize any particular portion of the article. Many devices, however, benefit from selective carbonization, such as the selective formation of filaments, conductive traces, or sensing regions within an un-carbonized and relatively inert material layer.

One method of selective carbonization utilizes photolithography techniques. While enabling selective carbonization via masking or patterning, such photolithography techniques typically require a clean-room environment, which can significantly add to the cost and complexity of such processes.

Laser pyrolysis has emerged as a technique of selective carbonization that does not require a clean-room environment. Generally, an article to be selectively carbonized is placed into a sealed container with a laser system. The laser system selectively operates a laser to form carbonized pathways along a surface of the article. In existing systems, the interior of the container is maintained as an inert environment in order to reduce a risk of burning material of the article. After the carbonization process is complete, hazardous byproducts from the carbonization process are vented from the container, and the article is retrieved. The need for a sealed container and inert environment as well as the need to vent the container prior to retrieving the carbonized article significantly increases the time, expense, and complexity to manufacturing articles via such processes.

Based on the foregoing, a selective laser carbonization process that reduces the risk of burning would be beneficial. A process that reduces manufacturing time, expense, or complexity would also be beneficial.

SUMMARY

A system for selectively carbonizing a polymer coating on a substrate includes a laser, a memory, and a controller. The memory stores data associated with at least one characteristic of a substrate having a coating that includes a polymer material. The controller is operatively connected to the laser, and is configured to control the laser based on the data such that, in an open-air environment, an interaction between the laser and the polymer material carbonizes a portion of the coating, but does not sustain combustion of the polymer material.

In some embodiments, the data includes a thermal characteristic of the substrate. The controller is configured to control the laser by tuning at least one parameter of the laser based on the thermal characteristic of the substrate.

In some embodiments, at least one parameter of the laser includes at least one of a power level, a movement speed, a pulse width, and a wavelength.

In some embodiments, thermal characteristic of the substrate includes a thermal insulation provided by the substrate.

In some embodiments, the data includes a thickness of the coating.

In some embodiments, the controller is configured to control the laser such that an entirety of the thickness of the portion of the coating is carbonized.

In some embodiments, the laser is a fiber laser.

In some embodiments, the data includes a material composition of the polymer material.

In some embodiments, the controller is configured to tune at least one parameter of the laser during the carbonization of a portion of the coating, such that an electrical resistance of the portion varies within the portion.

In some embodiments, the controller is configured to tune at least one parameter of the laser during the carbonization of a portion of the coating, such that an electronic resistance of the portion varies within the portion.

In some embodiments, the laser is configured to operate on three-dimensional surfaces and shapes.

In some embodiments, the system includes a sensor configured to sense at least one characteristic of the interaction between the laser and the polymer material during application of the laser. The data includes a predetermined threshold for the at least one characteristic of the interaction. The controller is configured to compare the at least one sensed characteristic of the interaction with the predetermined threshold, and tune at least one parameter of the laser based on the comparison such that the interaction does not sustain a combustion of the polymer material in the open-air environment.

In some embodiments, at least one characteristic of the interaction includes a temperature of the polymer material, and the predetermined threshold is based on a combustion temperature of the polymer material. In some embodiments, at least one characteristic of the interaction includes an amount of light produced via the interaction, and the predetermined threshold is based on an amount of light produced by combustion of the polymer material. In some embodiments, at least one characteristic of the interaction includes a presence of at least one substance chemically produced by combustion of the polymer material, and the predetermined threshold is based on a production of the at least one substance due to combustion of the polymer material.

A method of selectively carbonizing a polymer coating on a substrate includes controlling a laser system such that interaction between a laser and a polymer material forming a coating on a substrate carbonizes a portion of the coating, but does not sustain a combustion of the polymer material in an open-air environment.

In some embodiments, controlling the laser system includes tuning at least one parameter of the laser based on at least one of a thermal characteristic of the substrate, and a comparison between at least one characteristic of the interaction between the laser and the polymer material and a predetermined threshold for the at least one characteristic of the interaction.

In some embodiments, the coating has a thickness that is equal to or less than 15 micrometers.

In some embodiments, the coating includes Parylene or a Parylene derivative. In some embodiments, the substrate includes at least one layer of glass, silicon, silicon dioxide, gold, a photoresist, or a polymer.

In some embodiments, the carbonized portion of the coating forms a conductive trace in the coating.

In some embodiments, the method includes tuning at least one parameter of the laser during the carbonization of the portion, such that a resistance of the conductive trace varies within the coating.

In some embodiments, the method includes forming the substrate, and applying the coating to the substrate via chemical vapor deposition.

A method of producing an article with a selectively carbonized coating includes forming a substrate, applying a polymer coating to the substrate, and operating a laser system to selectively carbonize the polymer coating in an open-air environment. The polymer coating is applied via chemical vapor deposition to a thickness of less than 15 micrometers. Operating the laser system to selectively carbonize the polymer layer on the substrate includes tuning a laser so that interaction between the laser and the polymer coating is substantially thermal in an open-air environment, and in the open-air environment, applying the laser to a portion of the coating until the portion is carbonized.

In some embodiments, the laser is a fiber laser, and the polymer coating includes Parylene or a Parylene derivative.

In some embodiments, prior to carbonization, the polymer coating has a composition of approximately 94% Carbon, approximately 6% Chlorine, and approximately 0.6% Oxygen. After carbonization, carbonized portions of the coating have a composition of approximately 97% Carbon, approximately 2.7% Oxygen, and no Chlorine.

In some embodiments, the substrate and coating are non-planar.

In some embodiments, the substrate is a three-dimensional structure.

In some embodiments, forming the substrate is performed at least in part via operation of a three-dimensional object printer.

DETAILED DESCRIPTION

For the purposes of promoting an understanding of the principles of the embodiments described herein, reference is now made to the drawings and descriptions in the following written specification. No limitation to the scope of the subject matter is intended by the references. This disclosure also includes any alterations and modifications to the illustrated embodiments and includes further applications of the principles of the described embodiments as would normally occur to one of ordinary skill in the art to which this document pertains.

Figure 1:
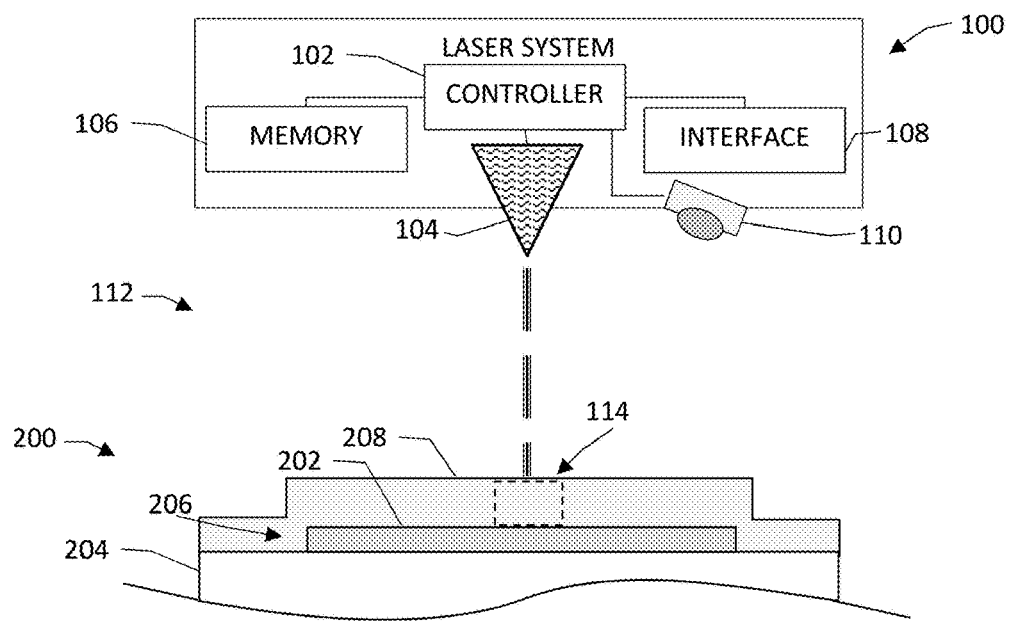
FIG. 1 depicts a side plan view of an exemplary embodiment of a laser system for selectively carbonizing a polymer coating according to this disclosure.

FIG. 1 depicts a side plan view of an exemplary embodiment of a laser system 100 for selectively carbonizing a substrate 200 with a polymer coating according to this disclosure. The system 100 includes a controller 102, a laser 104, a memory 106, an interface 108, and a sensor 110.

The substrate 200, as discussed in further detail below, includes an insulating layer 202 disposed directly on top of a base 204. The insulating layer 202, in this embodiment, is patterned into a patterned layer 206. A coating 208 that includes a polymer material is coated on top of the insulating layer 202. The substrate 200 is located in an open-air environment 112 of the system 100. As used herein "open-air environment" means an environment that is not controlled so as to be inert.

Figure 2:
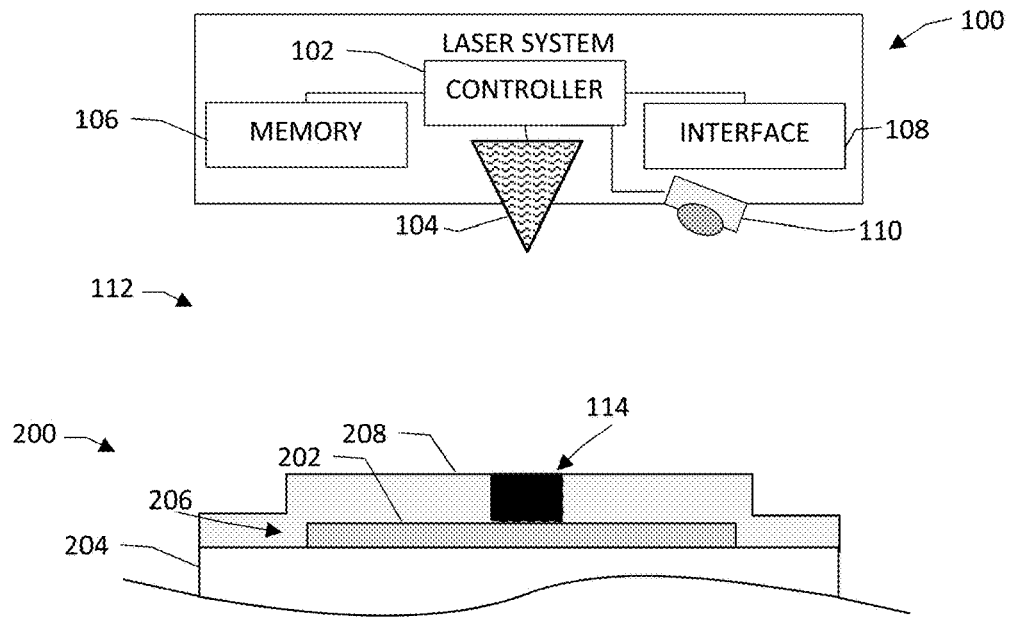
FIG. 2 depicts the laser system of FIG. 1 after a portion of a coating on a substrate has been carbonized.

While the substrate 200 in this embodiment is substantially planar, in other embodiments, the substrate is non-planar. In some embodiments, the substrate and the coating have three-dimensional shapes and surfaces. FIG. 2 depicts the system 100 and substrate 200 after the portion 114 of the coating 208 has been carbonized by the laser system 100. In this embodiment, the carbon in the carbonized portion 114 of the coating 208 is substantially amorphous carbon. In other embodiments, other types of carbon are produced, such as via different tunings of the laser 104.

The laser 104 is operatively connected to the controller 102. In this embodiment, the laser 104 is a fiber laser, such as an Nd:YAG laser or a Ytterbium laser. Other types of acceptable lasers are used in other embodiments. The laser 104 has a variety of parameters that are adjustable by the controller 102. In different embodiments, such parameters include at least one of wavelength, peak power, a speed at which the laser is moved over the substrate 200, a focal range, a spot size, and others The interface 108 is configured to receive an input of data associated with the substrate 200, such as from a user or from an external computing device. For example, in different embodiments, the data includes information associated with physical characteristics of the substrate such as a thickness of the coating 208, a material composition of the coating 208, a material composition of the polymer material, a material composition of the insulation layer 202, a material composition of the base 204, thermal characteristics of the substrate 200 such as a thermal insulation provided by the insulation layer 202 and/or the base 204, or combinations thereof. In some embodiments, the data input via the interface 108 also includes instructions associated with how the coating 208 is to be carbonized. In some embodiments, the interface 108 includes a graphical display, such as a graphical-user-interface.

The memory 106 stores the data associated with the substrate 200 input via the interface 108. In some embodiments, the memory 106 also stores data associated with the system 100, such as characteristics and parameters of the laser 104.

The controller 102 is operatively connected to the laser 104, and controls the laser 104 based on the data in the memory 106 so that, in the open-air environment 112 of the system 100, an interaction between the laser 104 and the polymer material of the coating 208 carbonizes a portion 114 of the coating 208, but does not sustain a combustion of the polymer material in the coating 208.

The sensor 110 provides feedback associated with the interaction between the laser 104 and the coating 208 to the controller 102. As discussed in further detail below, in some embodiments, the controller 102 controls the laser 104 based on feedback from the sensor 110. In other embodiments, the system 100 does not include a sensor 110.

In some embodiments, the controller 102 also controls the laser 104 based on data from the sensor 110 associated with characteristics of the interaction between the laser 104 and the polymer material of the coating 208, and on the data associated with the predetermined thresholds for those characteristics. In particular, the controller 102 compares a sensed characteristic with a predetermined threshold, and tunes the laser 104 based on the comparison, as discussed in further detail below.

Figure 3:
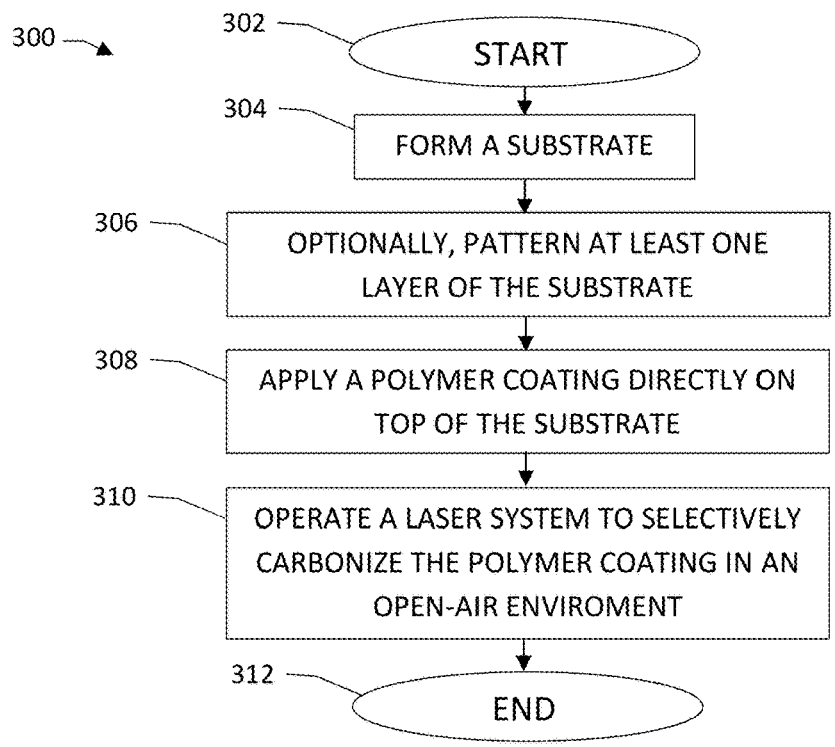
FIG. 3 depicts a flow diagram of an exemplary embodiment of a method of producing an article with a selectively carbonized coating using the laser system of FIG. 1 according to this disclosure.

FIG. 3 depicts a flow diagram of an exemplary embodiment of a method 300 of producing an article with a selectively carbonized coating using the laser system 100 according to this disclosure. The method 300 begins at 302. At 304, the substrate 200 is formed. Optionally, at 306, at least one layer of the substrate 200 is patterned. At 308, the coating 208 including the polymer material is applied directly on top of the insulating layer 202. At 310, the laser system 100 is operated to selectively carbonize the polymer coating 208 in an open-air environment, and the method ends at 312. Stages of the forgoing method 300 are discussed in further detail below with reference to FIGS. 4-6.

Figure 4:
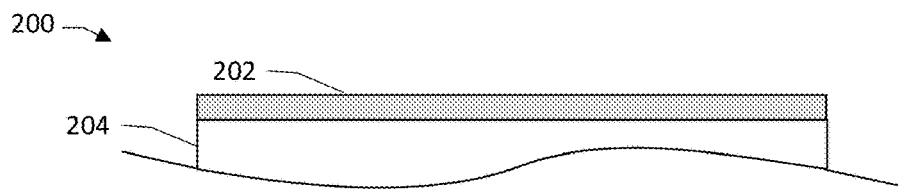
FIGS. 4-6 depict side plan views of different stages of forming an exemplary embodiment of a substrate with a polymer coating to be at least partially carbonized according to this disclosure.

FIG. 4 depicts a side plan view of a portion of an exemplary embodiment of a substrate 200 formed at 304 in the method 300. The substrate 200 includes an insulating layer 202 disposed on a base 204. The insulating layer 202 is made from any acceptable material, such as a glass, a silicon such as silicon dioxide, a metal such as gold, a photoresist material, a polymer, or combinations thereof. In some embodiments, the material or materials for the insulating layer 202 are selected for desirable properties that affect carbonization such as thermal insulation. The insulating layer 202 is applied to the base 204 via any acceptable process, such as chemical or physical vapor deposition, spin-coating, a chemical or electrochemical process, spray-coating, roll coating, bonding, or combinations thereof.

The base 204, in different embodiments, includes one or more layers of one or more acceptable materials. In some embodiments, the base 204 includes a layer of a glass or silicon. In some embodiments, the base 204 includes at least one layer of a polymer material.

In some embodiments, the substrate 200 does not include the base 204. In other embodiments, the insulating layer 202 is releasable from the base 204.

In some embodiments, at least a portion of the substrate 200 is formed via operation of a three-dimensional object printer. For example, in some embodiments, a three-dimensional object printer is operated to print one or more layers to form a three-dimensional base 204, and the insulating layer 202 is applied on top of the base 204 via any acceptable process. In some embodiments, the insulating layer 202 is also applied via operation of a three-dimensional object printer. Using a three-dimensional object printer enables the formation of non-planar substrates, and in particular the formation of complex three-dimensional substrates.

Figure 5:
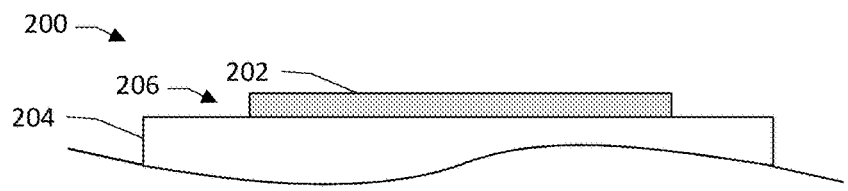

FIG. 5 depicts the substrate 200 after the insulating layer 202 has been optionally patterned (306 in FIG. 3) to form a patterned insulating layer 206. Such patterning can be performed via any acceptable process, including photolithography, micro-forming, epitaxy, doping, bonding, and combinations thereof. The pattern, in different embodiments, includes features that enable a desired behavior, such as a structural, electronic, mechanical, electromechanical, or electrochemical behavior, or combinations thereof. For example, in some embodiments, the pattern 206 includes an integrated circuit, an electrical contact, a sensor, or combinations thereof.

While the insulating layer 202 has been patterned into a patterned layer 206 in the embodiment depicted in FIG. 5, in other embodiments, one or more of the layers of the base 204 are patterned instead of or in addition to the insulating layer 202. In some embodiments, a device, such as an electronic device, mechanical device, etc., is included on or with or integrated into at least one of the insulating layer 202 and the base 204. In one embodiment, a device is integrated into the base, and the insulating layer 202 is patterned to provide an access or contact to the device.

Figure 6:
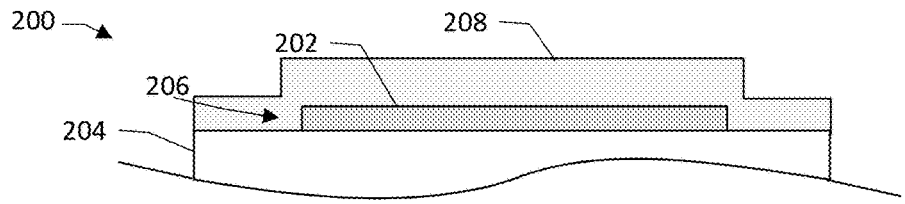

FIG. 6 depicts the substrate 200 after a coating 208 including a polymer material has been directly applied to the insulating layer 202 (308 in FIG. 3). Since, in this embodiment, the insulating layer 202 is a patterned layer 206, a portion of the coating 208 has also been applied to the at least one layer 204. In some embodiments, the coating 208 is selectively applied only to the patterned insulating layer 206 and not to the at least one layer 204. In some embodiments, an entirety of the substrate 200 is coated with the coating 208. In some embodiments, the coating 208 is patterned.

The coating 208 is formed from any acceptable material or combination of materials, such as for example Parylene or a Parylene derivative. Parylene-based coatings not only include favorable properties for selective carbonization, but also exhibit other favorable properties such as bio-compatibility, mechanical robustness, and general inertness. In this embodiment, the coating 208 has a thickness that is less than or equal to 15 micrometers. While other thicknesses are also contemplated, thicknesses greater than 15 micrometers can affect the carbonization process as discussed in further detail below.

The coating 208 is applied via any acceptable process. In one embodiment, chemical vapor deposition is used to apply a Parylene coating that is less than or equal to 15 micrometers thick. Chemical vapor deposition enables a substantially uniform coating, even when a substrate is irregular or has a complex three-dimensional shape, and even when the coating to be formed is relatively thin. In comparison, spin-coating is generally not optimized for producing coatings with a thickness under 100 micrometers, or for producing a substantially uniform coating on an irregular or complex substrate.

Figure 7:
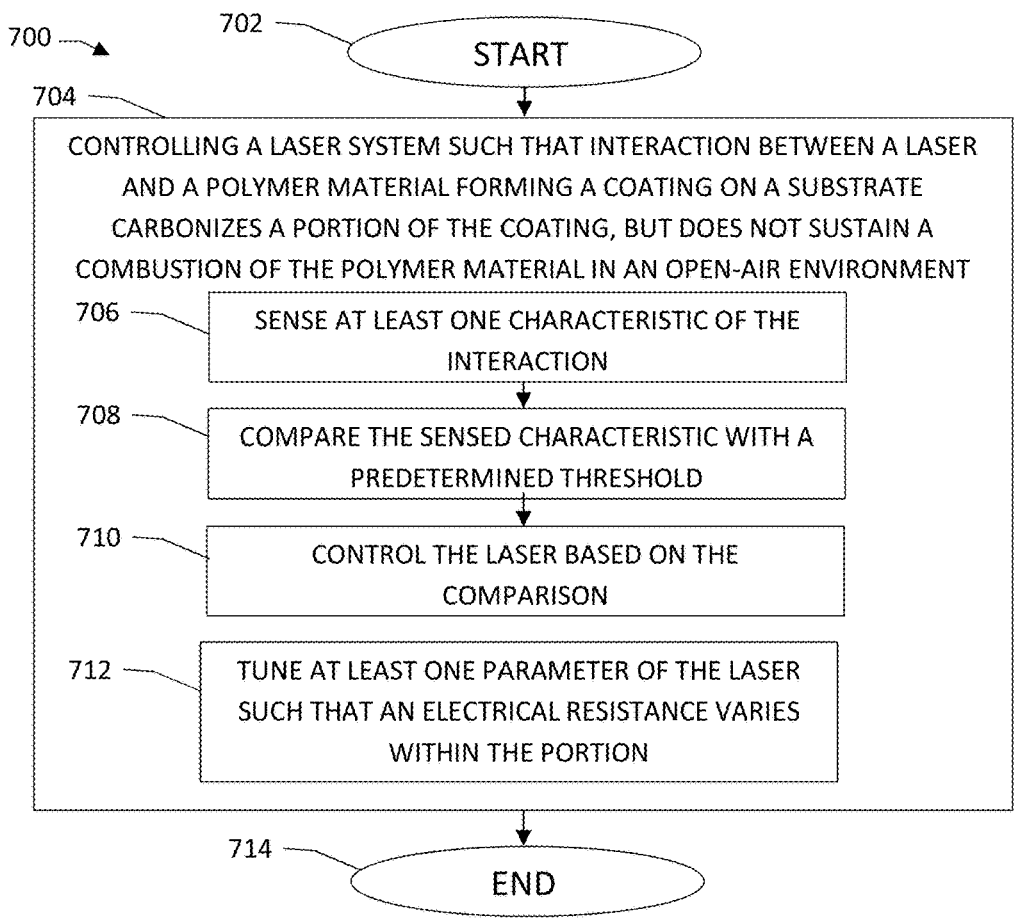
FIG. 7 depicts a flow diagram of an exemplary embodiment of a method of operating the laser system of FIG. 1.

FIG. 7 depicts a flow diagram of an exemplary methodology 700 of operating the laser system 100 to selectively carbonize a polymer coating of a substrate. The method starts at 702, and at 704 the controller 102 controls the laser 104 such that interaction between the laser and the polymer material forming the coating 208 on the substrate 200 carbonizes the portion 114 of the coating 208, but does not sustain a combustion of the polymer material in the open-air environment 112.

Generally, the effects of a laser applied to a material such as a polymer coating depends on a rate at which energy is introduced into material of the coating via the laser. At low levels, a laser may locally heat a material. At higher levels, the laser may induce localized pyrolysis. Pyrolysis is a process whereby a substance at least partially decomposes due to an increase in temperature. Specifically, the increased heat induces a chemical reaction, whereby resulting molecules are evaporated away.

Since different materials have different thermal properties, different materials will be induced to chemically react at different temperatures, with materials not induced to react left as a residue after reacting materials evaporate away. Carbonization refers to a pyrolytic process within a particular energy range configured to result in a residue that has a high carbon content, such as more than 95% by weight, or in particular 97% by weight or more. Customarily, the energy rate used to carbonize a polymer results in chemical reactions between material to be removed (typically chlorine, fluorine, or the like) that may produce hazardous byproducts. In existing laser carbonization techniques, the energy rate used to carbonize a material induces temperatures that, in a non-inert environment, would initiate combustion of the material. In particular, a non-inert environment includes materials such as oxygen which, in combination with energy provided by the laser, fuel combustion, with the result that a combustion reaction of a material can become at least partially self-sustaining during a laser carbonization process. Combustion not only produces undesirable harmful byproducts, but also damages the surrounding material. Thus, such laser carbonization techniques rely not only on an inert environment, but also on venting the environment within the system prior to any human interaction.

In contrast, the controller 102 according to this disclosure enables carbonization in a non-inert open-air environment by controlling the laser 104 such that interaction between the laser 104 and the polymer material in the coating 208 does not sustain combustion of the polymer material. In other words, the controller 102 controls the laser 104 such that the interaction between the laser 104 and the polymer material is substantially thermal, rather than chemical in the open-air environment 112. Controlling the laser 104 in this manner results in a substantial portion of the non-carbon constituents of the coating 208 reacting and evaporating away, leaving a localized portion of the coating 208 with a high carbon content as a residue.

Thermal insulation provided by the substrate 200 and the insulating layer 202 enables the coating 208 to retain energy imparted by the laser 104 that would otherwise dissipate. As a result, an amount of energy to initialize carbonization of the coating 208 is significantly reduced relative to the energy used to initiate carbonization of a polymer material in conventional practice. The energy applied by the laser 104 is adjustable via control of a variety of the parameters of the laser 104. In particular, the energy imparted by the laser 104 is controllable via adjusting at least one of a power level, a movement speed, a pulse width, and a wavelength of the laser 104.

The reduced energy of the laser reduces the energy that causes non-carbon materials removed from the coating 208 to react. The reduced energy from the laser is generally unable to initiate a self-sustaining reaction in the coating 208, and thus mitigates the risk of combustion.

In some embodiments, the controller 102 controls the laser 104 such that an entirety of the thickness of the portion 114 of the coating 208 is carbonized by the laser 104. In other embodiments, less than an entirety of the thickness is carbonized. The controller 102, in some embodiments, controls the laser 104 based on the thickness of the coating 208, or on a partial thickness of the coating 208 that is desirably carbonized. Carbonizing a thickness of the polymer material that is less than or equal to 15 micrometers optimizes a reduction in the energy needed and a uniformity of the polymer material of the coating 208.

In some embodiments, controlling the laser 104 includes using feedback from the sensor 110 to adjust the control of the laser 104. Thus, optionally at 706, the sensor 110 senses at least one characteristic of the interaction between the laser 104 and the polymer material of the coating 208 during application of the laser 104. At 708, the controller 102 compares a sensed characteristic of the interaction with a predetermined threshold for that characteristic from the data in the memory, and at 710, the controller 102 adjusts the control of the laser 104 based on that comparison.

Characteristics of the interaction sensed by the sensor 110 relate to phenomenon associated with combustion of the polymer material. Combustion of a material generally results in, for example, a rise in temperature, a production of light, a chemical change in a substance, etc. Thus, in some embodiments, the sensor 110 senses a temperature of the polymer material during application of the laser 104. The predetermined threshold in such embodiments includes a threshold temperature based on a combustion temperature of the polymer material. In some embodiments, the sensor 110 senses an amount of light produced by the interaction, and the predetermined threshold includes a threshold amount of light released due to combustion of the polymer material. In some embodiments, the sensor senses a presence or quantity of a material produced due to combustion of the polymer material, and the predetermined threshold includes a threshold amount of that material present in the system 100.

In some embodiments, the predetermined thresholds are selected such that combustion of the polymer material is not possible. In other words, the predetermined thresholds are selected to enable the controller 102 to adjust the parameters of the laser prior to combustion of the polymer being initiated. For example, in some embodiments, the threshold temperature is below the combustion temperature of the polymer material. The controller 102 reduces the energy imparted by the laser in response to the sensor 110 sensing the threshold temperature, and the polymer material never reaches the combustion temperature.

In some embodiments, the predetermined thresholds are selected to identify that combustion has been initiated. In other words, the sensor 110 sensing that a characteristic of the interaction has reached the predetermined threshold is indicative that the polymer is beginning to combust. Even in cases where combustion has begun, the controller 102 prevents the combustion from self-sustaining by reducing the amount of energy imparted by the laser to a level that, even in combination with a non-inert environment, is insufficient to sustain combustion.

Optionally, at 712, at least one parameter of the laser 104 is adjusted during application of the laser 104 to the coating 208. In particular, the laser 104 is adjusted so that a resistance varies within the portion carbonized by the system 100. In some embodiments, the carbonized portion 114 of the coating 208 has a lower resistance relative to un-carbonized portions of the coating 208, and thus forms a conductive pathway or trace within the coating 208. Adjusting the laser 104 during carbonization enables the formation of conductive pathways with different or variable resistance.

The method ends at 714.

FIG. 14 depicts the sample 1300 after a laser carbonization process according to this disclosure was used to form a 1× linear hatch 1308 in the Parylene coating. After the laser carbonization process, the sheet resistance across the carbonized Parylene coating was approximately 270 Ohms per square. Also, as tabulated below in Table 2, the paths subjected to carbonization by the laser had increased in carbon content to approximately 97% carbon by weight.

TABLE 2

Gold Substrate Post-Carbonization

| Loca-tion | Element Composition % by Weight (* = within detectable range) | | | | | | | | | |
|---|---|---|---|---|---|---|---|---|---|---|
| | C | N | O | F | Na | Al | Si | S | Cl | Au |
| 1 | 97.2 | — | 2.6 | — | — | — | 0.2 | — | — | * |
| 2 | 97.1 | — | 2.7 | — | — | — | 0.2 | — | — | * |

In different embodiments, carbonized portions or pathways in a coating according to this disclosure are adapted for a wide variety of uses.

In some embodiments, carbonized pathways form conductive traces in the coating. In some embodiments, the laser is further tuned during the application of the laser carbonization process in order to vary a % by weight of carbon along a carbonized pathway so that a resistance of the conductive track varies within the coating of polymer material.

In some embodiments, carbonized pathways or portions according to this disclosure form at least a portion of a sensor. In some embodiments, the sensor is an electrochemical sensor. In some embodiments, the sensor is configured to detect, for example, pesticides, potassium, transition metals in water, vitamins, hormones, or combinations thereof. In some embodiments, the sensor is used for DNA sensor transduction.

In some embodiments, carbonized pathways or portions according to this disclosure form at least a portion of an implantable device.

The laser carbonization process according to this disclosure is also adapted to operating on substrates that are non-planar, such as irregular substrates or substrates with a complex three-dimensional structure. In one embodiment, a substrate with a polymer coating according to this disclosure has a complex three-dimensional structure. A laser carbonization process according to this discloser forms carbonized pathways or portions that extend in three-dimensions over the coating on the three-dimensional structure.

In one embodiment, a laser system is integrated into a three-dimensional object printer. The laser system is configured to carbonized portions of individual layers as the layers are deposited via operation of the three-dimensional object printer.

It will be appreciated that variants of the above-described and other features and functions, or alternatives thereof, may be desirably combined into many other different systems, applications or methods. Various presently unforeseen or unanticipated alternatives, modifications, variations or improvements may be subsequently made by those skilled in the art that are also intended to be encompassed by the disclosure.

The invention claimed is:

1. A system for selectively carbonizing a polymer coating on a substrate, comprising:
 a laser;
 a memory storing data associated with at least one characteristic of a substrate having a coating that includes a polymer material; and
 a controller operatively connected to the laser, and configured to control the laser based on the data such that, in an open-air environment, an interaction between the laser and the polymer material carbonizes a portion of the coating, but does not sustain a combustion of the polymer material.

2. The system of claim 1, wherein:
 the data includes a thermal characteristic of the substrate; and
 the controller is configured to control the laser by tuning at least one parameter of the laser based on the thermal characteristic of the substrate.

3. The system of claim 2, wherein the at least one parameter of the laser includes at least one of a power level, a movement speed, a pulse width, and a wavelength.

4. The system of claim 2, wherein the thermal characteristic of the substrate includes a thermal insulation provided by the substrate.

5. The system of claim 1, wherein the data includes a thickness of the coating.

6. The system of claim 5, wherein the controller is configured to control the laser such that an entirety of the thickness of the portion of the coating is carbonized.

7. The system of claim 1, wherein the laser is a fiber laser.

8. The system of claim 1, wherein the data includes a material composition of the polymer material.

9. The system of claim 8, wherein the controller is configured to control the laser so as to carbonize the portion of the coating to have a carbon content of approximately 97% by weight, or more.

10. The system of claim 1, wherein the controller is further configured to tune at least one parameter of the laser during the carbonization of the portion, such that an electrical resistance of the portion varies within the portion.

11. The system of claim 1, wherein the laser is configured to operate on three-dimensional surfaces and shapes.

12. The system of claim 1, further comprising:
 a sensor configured to sense at least one characteristic of the interaction between the laser and the polymer material during application of the laser;
 wherein the data includes a predetermined threshold for the at least one characteristic of the interaction; and
 wherein the controller is further configured to:
 compare the at least one sensed characteristic of the interaction with the predetermined threshold; and
 tune at least one parameter of the laser based on the comparison such that the interaction does not sustain a combustion of the polymer material in the open-air environment.

13. The system of claim 12, wherein at least one of:
 the at least one characteristic of the interaction includes a temperature of the polymer material, and the predetermined threshold is based on a combustion temperature of the polymer material;
 the at least one characteristic of the interaction includes an amount of light produced via the interaction, and the predetermined threshold is based on an amount of light produced by combustion of the polymer material; and
 the at least one characteristic of the interaction includes a presence of at least one substance chemically produced by combustion of the polymer material, and the predetermined threshold is based on a production of the at least one substance due to combustion of the polymer material.

14. A method of selectively carbonizing a polymer coating on a substrate, comprising:
controlling a laser system such that interaction between a laser and a polymer material forming a coating on a substrate carbonizes a portion of the coating, but does not sustain a combustion of the polymer material in an open-air environment.

15. The method of claim 14, wherein controlling the laser system includes tuning at least one parameter of the laser based on at least one of:
a thermal characteristic of the substrate; and
a comparison between at least one characteristic of the interaction between the laser and the polymer material and a predetermined threshold for the at least one characteristic of the interaction.

16. The method of claim 14, wherein the coating has a thickness that is equal to or less than 15 micrometers.

17. The method of claim 16, wherein:
the coating includes Parylene or a Parylene derivative; and
the substrate includes at least one layer of glass, silicon, silicon dioxide, gold, a photoresist, or a polymer.

18. The method of claim 14, wherein the carbonized portion of the coating forms a conductive trace in the coating.

19. The method of claim 18, further comprising:
tuning at least one parameter of the laser during the carbonization of the portion, such that a resistance of the conductive trace varies within the coating.

20. The method of claim 14, further comprising:
forming the substrate; and
applying the coating to the substrate via chemical vapor deposition.

* * * * *